(12) United States Patent
Baijal et al.

(10) Patent No.: US 10,848,901 B2
(45) Date of Patent: Nov. 24, 2020

(54) SOUND OUTPUT APPARATUS AND METHOD FOR PROCESSING SOUND SIGNAL BASED ON DYNAMIC RANGE CORRESPONDING TO VOLUME SET

(71) Applicant: SAMSUNG ELECTRONICS CO., LTD., Suwon-si (KR)

(72) Inventors: Anant Baijal, Suwon-si (KR); Hyeon-sik Jeong, Yongin-si (KR); Sang-mo Son, Suwon-si (KR); Byeong-seob Ko, Suwon-si (KR); Hae-kwang Park, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/017,283

(22) Filed: Jun. 25, 2018

(65) Prior Publication Data
US 2019/0014435 A1 Jan. 10, 2019

(30) Foreign Application Priority Data
Jul. 7, 2017 (KR) .................. 10-2017-0086412

(51) Int. Cl.
*H04S 7/00* (2006.01)
*H04R 5/04* (2006.01)
*H04R 3/04* (2006.01)

(52) U.S. Cl.
CPC .............. *H04S 7/307* (2013.01); *H04R 3/04* (2013.01); *H04R 5/04* (2013.01); *H04S 2400/13* (2013.01)

(58) Field of Classification Search
None
See application file for complete search history.

(56) References Cited

U.S. PATENT DOCUMENTS

| 6,965,676 | B1 | 11/2005 | Allred |
| 8,918,197 | B2 | 12/2014 | Suhami |
| 9,391,579 | B2 | 7/2016 | Walsh et al. |
| 2004/0234089 | A1 | 11/2004 | Rembrand et al. |
| 2007/0291959 | A1 | 12/2007 | Seefeldt |

(Continued)

FOREIGN PATENT DOCUMENTS

| CN | 105825851 A | 8/2016 |
| EP | 2 693 635 A1 | 2/2014 |

(Continued)

OTHER PUBLICATIONS

PCT International Search Report issued in PCT International Application No. PCT/KR2018/007270 dated Oct. 19, 2018 (3 pages).

(Continued)

*Primary Examiner* — James K Mooney
(74) *Attorney, Agent, or Firm* — Staas & Halsey LLP

(57) ABSTRACT

A sound output apparatus is provided. The sound output apparatus according to an embodiment includes an inputter, an outputter, a storage configured to store mapping information between a volume level and a dynamic range of the sound output apparatus and a processor configured to obtain a dynamic range corresponding to a volume level currently set to the sound output apparatus based on the mapping information, process a sound signal input through the inputter based on the dynamic range and output the processed sound signal through the outputter.

17 Claims, 19 Drawing Sheets

(56) References Cited

U.S. PATENT DOCUMENTS

| | | |
|---|---|---|
| 2008/0187149 A1 | 8/2008 | Jung |
| 2009/0016547 A1* | 1/2009 | Aoki .................. H03G 3/02 381/107 |
| 2009/0051507 A1 | 2/2009 | Outlaw et al. |
| 2012/0063616 A1 | 3/2012 | Walsh et al. |
| 2012/0106759 A1 | 5/2012 | Chung |
| 2012/0128178 A1* | 5/2012 | Fujii .................. G10L 21/02 381/98 |
| 2014/0198922 A1 | 7/2014 | Mauger et al. |
| 2014/0334642 A1 | 11/2014 | Kwak |
| 2015/0156588 A1 | 6/2015 | Kyriakakis et al. |
| 2015/0350783 A1 | 12/2015 | Krishnaswamy et al. |
| 2017/0048615 A1 | 2/2017 | Son et al. |
| 2017/0097805 A1 | 4/2017 | Aoki et al. |

FOREIGN PATENT DOCUMENTS

| | | |
|---|---|---|
| EP | 3 038 255 A2 | 6/2016 |
| JP | 5-226953 A | 9/1993 |
| JP | 2010-537294 | 12/2010 |
| JP | 2015-179991 | 10/2015 |
| KR | 10-0494288 | 6/2005 |
| KR | 10-1368927 | 2/2014 |
| KR | 10-1551664 | 9/2015 |
| KR | 10-2017-0019738 | 2/2017 |

OTHER PUBLICATIONS

PCT International Search Report issued Written Opinion in PCT International Application No. PCT/KR2018/007270 dated Oct. 19, 2018 (6 pages).

Extended European Search Report dated Feb. 25, 2020 from European Application No. 18828681.9, 7 pages.

European Office Action dated Jul. 30, 2020 from European Application No. 18828681.9, 5 pages.

* cited by examiner

100

SOUND OUTPUT APPARATUS AND METHOD FOR PROCESSING SOUND SIGNAL BASED ON DYNAMIC RANGE CORRESPONDING TO VOLUME SET

CROSS-REFERENCE TO RELATED APPLICATIONS

This application claims priority from Korean Patent Application No. 10-2017-0086412, filed on Jul. 7, 2017, in the Korean Intellectual Property Office, the disclosure of which is incorporated herein by reference in its entirety.

BACKGROUND

1. Field of the Invention

Devices and methods consistent with what is disclosed herein relate to a sound output apparatus and a signal processing method thereof, and more particularly, to a sound output apparatus that adjusts a sound output level based on an audible level of a user and a signal processing method thereof.

2. Description of the Related Art

With the development of electronic technology, various types of electronic apparatuses have been developed and widely used. Particularly, display apparatuses that are used in homes, offices, public places, or the like have been continuously developed in recent years.

Among image processing techniques that are applied to advanced display apparatuses, a high dynamic range (HDR) correction technique is a technique that analyzes the contrast in detail and shows an image as if it was perceived by the human eye. An optimum contrast ratio may be provided through tone mapping in the HDR correction process.

A dynamic range is very important for listening to audio contents. Accordingly, there is a need for a technique to apply an optimum dynamic range as in the case of video contents.

SUMMARY

An aspect of the exemplary embodiments relates to providing a sound output apparatus for obtaining an optimum dynamic range based on volume setting of a sound output apparatus and processing a sound signal based thereon and a signal processing method. Particularly, according to an embodiment of the present disclosure, a sound signal may be processed considering not only the system characteristics such as the volume setting but also the auditory characteristic of a user and the characteristic of a sound signal.

According to an exemplary embodiment, there is provided a sound output apparatus including an inputter, an outputter, a storage configured to store mapping information between a volume level and a dynamic range of the sound output apparatus; and a processor configured to obtain a dynamic range corresponding to a volume level currently set to the sound output apparatus based on the mapping information, process a sound signal input through the inputter based on the obtained dynamic range and output the processed sound signal through the outputter.

The processor may be further configured to, based on the set volume level being changed, obtain a changed dynamic range corresponding to the changed volume level and process the input sound signal based on the changed dynamic range.

The mapping information stored in the storage may be information to which audible level information of a user is reflected.

The processor may be further configured to modify the dynamic range obtained from the storage based on audible level information of a user, and process the input sound signal based on the modified dynamic range.

The processor may be further configured to adjust a magnitude of the input sound signal to be different for each frequency of the input sound signal within the obtained dynamic range based on auditory perception characteristic information.

The processor may be further configured to adjust a magnitude of the sound signal based on characteristic of the input sound signal and the auditory perception characteristic information, and wherein the characteristic of the input sound signal includes characteristic of a primary frequency component in the input sound signal.

The auditory perception characteristic information may include at least one of a predetermined psychoacoustic model and user-customized auditory perception characteristic information.

The processor may be further configured to adjust a filter coefficient of wave-shaping filters based on the obtained dynamic range and the auditory perception characteristic information, and filter the input sound signal based on the adjusted filter coefficient.

The processor may be further configured to identify (or determine) a magnitude of the sound signal in a predetermined processing unit, identify (or determine) a first magnitude to be adjusted by the processing unit based on the obtained dynamic range and the identified (or determined) magnitude, and adjust the first magnitude for each frequency component included in the processing unit based on the auditory perception characteristic information.

The processor may be further configured to, based on a difference in magnitude between a first sound signal and a second sound signal included in a boundary area between a first processing unit and a second processing unit adjacent to the first processing unit being greater than or equal to a predetermined threshold magnitude, further adjust at least one of magnitudes of the first sound signal and the second sound signal and a difference in magnitude between the first sound signal and the second sound signal is smaller than the predetermined threshold magnitude.

The storage may further store gain information for adjusting a magnitude of a sound signal identified (or determined) based on a dynamic range for each volume level of the sound output apparatus and the auditory perception characteristic information.

The processor may be further configured to, based on the input sound signal being a stereo signal, perform rendering of the stereo signal by separating the stereo signal into a center signal and an ambient signal, process at least one of the rendered center signal and the rendered ambient signal based on the obtained dynamic range before the rendered center signal and the rendered ambient signal are respectively mixed, or process a signal obtained by mixing the rendered center signal with the rendered ambient signal based on the obtained dynamic range.

The processor may be further configured to perform high frequency restoration based on the obtained dynamic range in the case where the input sound signal is a compressed signal.

According to an exemplary embodiment, there is provided a signal processing method for a sound output apparatus, the method including obtaining a dynamic range corresponding to a volume level which is currently set to the sound output apparatus based on mapping information between a volume level and a dynamic range of the sound output apparatus, processing an input sound signal based on the obtained dynamic range, and outputting the processed sound signal.

The method may further include, based on the set volume level being changed according to a user command, obtaining a changed dynamic range corresponding to the changed volume level and processing the sound signal based on the changed dynamic range.

The mapping information may be information to which audible level information of a user is reflected.

The processing of the input sound signal may include adjusting a magnitude of the sound signal to be different for each frequency of the input sound signal within the obtained dynamic range based on auditory perception characteristic information.

The processing of the input sound signal may include adjusting a magnitude of the input sound signal based on characteristic of the input sound signal and auditory perception characteristic information, and wherein the characteristic of the input sound signal includes characteristic of a primary frequency component in the sound signal.

The auditory perception characteristic information may include at least one of a predetermined psychoacoustic model and user customized auditory perception characteristic information.

According to an exemplary embodiment, there is provided a non-transitory computer readable recording medium that stores a computer command for causing the sound output apparatus to perform an operation when executed by a processor of a sound output apparatus, wherein the operation includes obtaining a dynamic range of the sound output apparatus based on a volume level currently set to the sound output apparatus and processing an input sound signal based on the obtained dynamic range.

According to the above-described various exemplary embodiments, a sound output apparatus processes a sound signal considering not only the system characteristic such as volume setting but also the auditory characteristic of a user, and the characteristic of a sound signal, thereby providing the optimum sound contents.

DETAILED DESCRIPTION OF EXEMPLARY EMBODIMENTS

Figure 1:
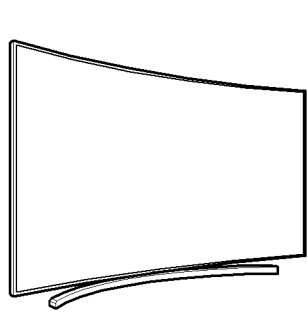
FIG. 1 is a view to explain an example embodiment of a sound output apparatus according to an embodiment of the present disclosure.
Figure 1:
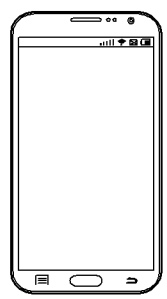
Figure 1:
Figure 1:
Figure 1:
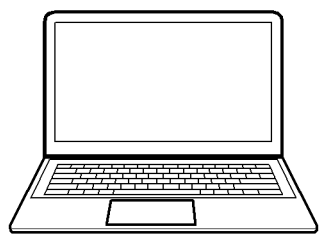
Figure 1:
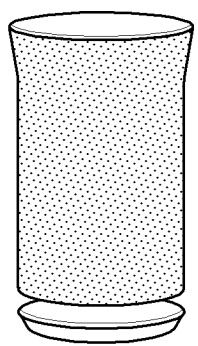
Figure 1:
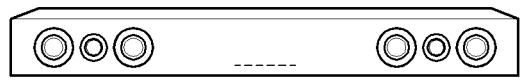
Figure 1:
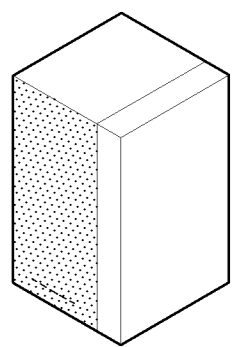

Hereinafter, the present disclosure will be described in detail with reference to the drawings. In the following description, the configuration which is publicly known but irrelevant to the gist of the present disclosure could be omitted. In addition, the following embodiments may be modified into various other forms, and the scope of the technical spirit of the present disclosure is not limited to the following examples. Rather, these embodiments are provided so that the present disclosure will be more thorough and complete, and will fully convey the scope of the technical spirit of the present disclosure to those skilled in the art.

When an element is referred to as "including" a component, this indicates that the element may further include another component instead of excluding another component unless there is different disclosure. Further, various elements and regions in the drawings are schematically drawn. Accordingly, the technical spirit of the present disclosure is not limited by the relative size or spacing illustrated in the accompanying drawings.

Hereinafter, the present disclosure will be described in detail with reference to the accompanying drawings.

FIG. 1 is a view to explain an example embodiment of a sound output apparatus according to an embodiment of the present disclosure.

According to FIG. 1, a sound output apparatus 100 may be implemented as various types of apparatuses capable of outputting sound such as a digital TV, an audio apparatus, a user terminal apparatus, a sound bar, a home theater system, a room speaker, a headphone, an earphone, etc.

For example, the sound output apparatus 100 may include at least one speaker unit. The speaker unit may convert electric pulses into sound waves, and may be embodied as a dynamic type according to the principle and method for converting electric signals into sound waves. However, the present disclosure is not limited thereto, and it may be implemented as an electrostatic type, a dielectric body type, a magnetostrictive type, or the like within the scope of the present disclosure.

When the sound output apparatus 100 includes a plurality of speaker units, the plurality of speaker units may respectively reproduce a plurality of channels such as 2-channel, 2.1-channel, 3-channel, 3.1-channel, 5.1-channel, 7.1-channel, etc. For example, the plurality of speaker units may include a C (center) channel speaker, an L (left) channel speaker, and an R (right) channel speaker.

According to an embodiment, the sound output apparatus 100 may obtain a dynamic range of the sound output apparatus 100 based on a setting volume, i.e. a set volume level, and process and output a sound signal based thereon. Hereinafter, various embodiments of the present disclosure will be described with reference to the drawings.

Figure 2:
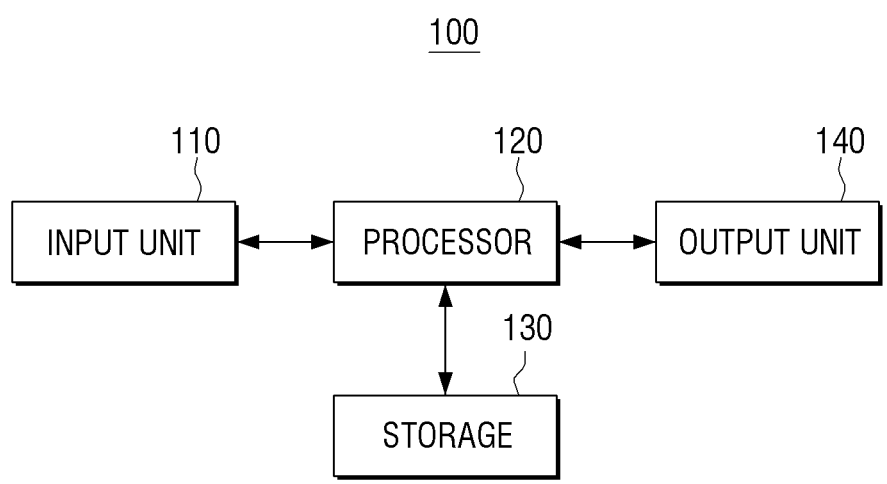
FIG. 2 is a block diagram illustrating configuration of a sound output apparatus according to an embodiment of the present disclosure.

FIG. 2 is a block diagram illustrating configuration of a sound output apparatus according to an embodiment of the present disclosure.

Referring to FIG. 2, a sound output apparatus 100 may include an input unit (or inputter) 110, a processor 120, a storage 130 and an output unit (or outputter) 140.

The input unit 110 may receive a sound signal. For example, the input unit 110 may receive sound signals in a streaming or downloading manner from an external device (e.g., a source device), an external storage medium (e.g., a USB), an external server (e.g., a web hard), or the like via a communication method such as AP-based Wireless LAN network (Wi-Fi), Bluetooth, Zigbee, wired/wireless Local Area Network (LAN), WAN, Ethernet, IEEE 1394, HDMI, USB, MHL, AES/EBU, Optical, Coaxial, etc.

The sound signal may be a digital sound signal, but the present disclosure is not limited thereto. The digital sound signal may be a data signal of an analog signal, and the data is set to use a specific transmission format according to a communication protocol.

For example, the digital sound signal may be modulated from an analog sound signal according to a Pulse Code Modulation (PCM) method. A method for converting an analog signal having temporal continuity into a temporally discrete signal may be referred to as the PCM method. Specifically, the PCM method may include generating a Pulse Amplitude Modulation (PAM) signal by sampling an analog signal, quantizing a sampling value (an amplitude) of the PAM signal, i.e. a discrete signal, and encoding the signal into a binary or multi-numeration bit string (a digital signal). In other words, the PCM signal may be transmitted by sampling an analog sound signal, converting the sampled signal into a PAM signal, quantizing each sampling pulse of the PAM signal and converting it into a code. Accordingly, the sound output apparatus 100 may decode the received sound signal (i.e. the PCM signal) and convert the decoded signal into a PAM signal and interpolate the PAM signal to obtain an original input signal.

Meanwhile, the input digital sound signal may be a signal sampled at a predetermined sampling frequency as described above. The sampling frequency (Hz (hertz) may refer to the number of representative values of the original analog signal sampled in one second. In other words, if the sampling frequency is 10 times per second, the sampling frequency may be 10 Hz, and if the sampling frequency is 100 times per second, the sampling frequency may be 100 Hz. For example, a digital sound signal may be a signal sampled at a frequency that is at least twice the highest frequency in the analog sound signal according to the Sampling theorem (or the Nyquist theory).

As an example, when human's maximum audio frequency is 20 kHz and a signal is sampled at twice the frequency of 20 kHz, for example, a signal may be sampled at 44.1 kHz, 48 kHz, or the like. Sampling a signal at 48 kHz means that 48,000 samples were extracted from an analog audio signal in one second. Various sampling frequencies such as 32 kHz, 38 kHz, 44.1 kHz, 88.2 kHz, 96 kHz and 192 kHz may be used depending on the use. Hereinafter, for convenience of explanation, it is assumed that a digital sound signal is a signal sampled at the frequency of 48 kHz.

The processor 120 may control the overall operation of the sound output apparatus 100.

According to an embodiment, the processor 120 may be implemented with a digital signal processor (DSP) that processes digital sound signals, a microprocessor, or the like, but the present disclosure is not limited thereto. The processor 120 may include one or more of a central processing unit (CPU), a microcontroller unit (MCU), a micro processing unit (MPU), a controller, an application processor (AP), a communication processor (CP), an ARM processor, or the like, or may be defined by the term. The processor 120 may be implemented as a system on chip (SoC) where a processing algorithm is embedded, a large scale integration (LSI), or the like or may be embodied in the form of a Field Programmable Gate Array (FPGA).

The processor 120 may obtain a dynamic range of the sound output apparatus 100 based on a volume set to the sound output apparatus 100 (or a system volume) and process a sound signal based on the obtained dynamic range. The setting volume level may be a volume level set by a user among volume levels that can be provided by the sound output apparatus 100.

Based on the set volume level being changed according to a user command, the processor 120 may obtain a changed dynamic range corresponding to the changed volume level and process a sound signal based on the changed dynamic range.

A plurality of volume levels that can be provided by the sound output apparatus 100 may vary depending on a manufacturer, type, model, etc. A different magnitude (e.g., a sound pressure level) may be mapped to the same volume level (e.g., 10 level) for each characteristic of the sound output apparatus 100.

The dynamic range may refer to the amplitude range (or a sound pressure ratio) of the largest signal playback sound and the smallest signal playback sound in decibels (dB). The maximum dynamic range of the sound output apparatus 100 may be generally limited by the bit depth (or sample bit) of the sound output apparatus 100. For sound signals, the resolution of the frequency (pitch) may be expressed in Hz, and the resolution for magnitude (intensity or volume) may be expressed in bits. Specifically, when an analog signal is digitized, a value indicating whether a continuous sound for one second is divided into a plurality of pieces for digitizing may be a sampling rate, and a value indicating which number of levels the magnitude value of the sound of each of the divided signal pieces is classified into and changed in number may be the bit depth. Typically, the intensity of digital audio may be expressed by allocating 6 decibel per one audio bit depth. For example, the most commonly used 16-bit/48 KHz audio of the digital video refers to a sound signal that is sampled and represented with a range of 0 to 96 dB (dbspl) (deci-Bell sound pressure level) at the precision in which the sound is divided into 65536(=216) steps in 48,000 times per second. There is a bit depth that can be processed according to the performance of the sound output apparatus 100 itself. Based on the above description, the dynamic range of the sound output apparatus 100 may increase as the bit depth that can be processed by the sound output apparatus 100 increases.

It is well known that a maximum dynamic range is limited by a bit depth according to the performance of the sound output apparatus 100. However, the present disclosure is different from the conventional technology in obtaining a dynamic range based on a present setting volume of the sound output apparatus 100 and processing a sound signal based thereon.

The processor 120 may obtain a dynamic range based on a setting volume of the sound output apparatus 100 and audible level information. According to an embodiment, an average audible level of human being (e.g., −96 dB (dbfs) (deci-Bell full scale) at the maximum level) may be used as the audible level information. According to another embodiment, when the sound output apparatus 100 acquires an audible level of a user, the acquired audio level may be used. For example, a user profile based audible level based on gender, age, etc. may be used, or a user customized audible level obtained by user hearing measurement may be used.

The processor 120 may obtain a dynamic range corresponding to a setting volume of the sound output apparatus 100 based on mapping information between a volume level and a dynamic range of the sound output apparatus 100. In this case, the mapping information may be pre-stored in the storage 130 or received from an external server. The mapping information may be information to which an audible level of a user is reflected or is not reflected. However, for convenience of explanation, it is assumed that the user audible level is not reflected to the mapping information.

The processor 120 may obtain a dynamic range corresponding to a set volume level based on mapping information, modify the obtained dynamic range based on the audible level of the user and process a sound signal based thereon.

Figure 3:
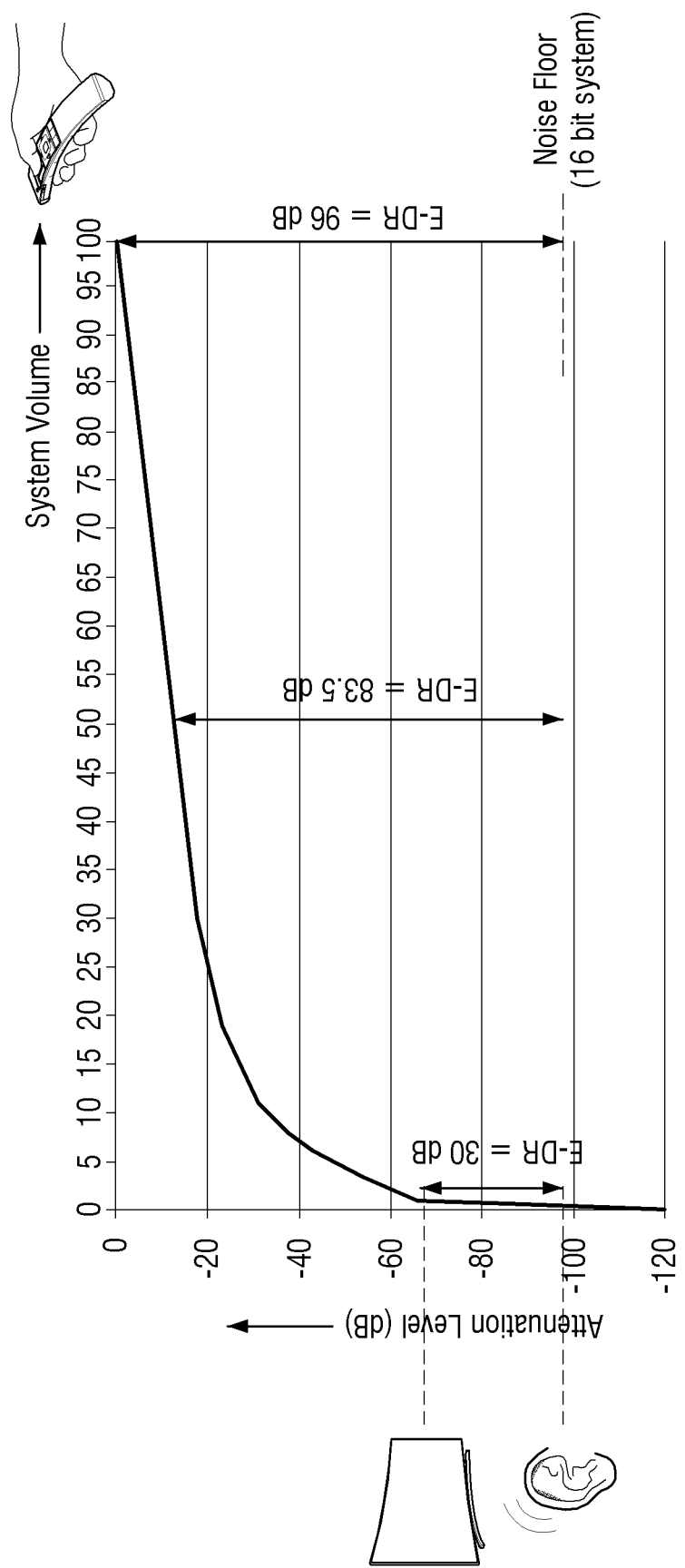
FIG. 3 is a view to explain a method for obtaining a dynamic range according to an embodiment of the present disclosure.

FIG. 3 is a view to explain a method for obtaining a dynamic range according to an embodiment of the present disclosure.

FIG. 3 is a graph illustrating a mapping relationship between a volume level and a dynamic range of the sound output apparatus 100. Referring to FIG. 3, a dynamic range may change according to a setting volume level of the sound output apparatus 100. For example, when a volume level is between 0 and 100, for the 16-bit sound output apparatus, a dynamic range according to a maximum setting volume (e.g., a volume 100 level) may be −96 dB to 0dB. However, when a dynamic range is reduced by 66 dB as a setting volume level is reduced (e.g., a volume 2 level), a dynamic range of the sound output apparatus 100 may be reduced from −96 dB to 0 dB to −162 dB to −66 dB. That is, a dynamic range at the volume 2 level may be −162 dB to −66 dB.

However, a dynamic range of human hearing (that is, an audible level) may be approximately −96 dB. In other words, people cannot hear sounds below −96 dB. The processor 120 may obtain a dynamic range of −96 dB to −66 dB corresponding to a setting volume and an audible level of the sound output apparatus 100.

The present disclosure is different from the conventional technology in obtaining a dynamic range corresponding to a setting volume level of the sound output apparatus 100 and using the dynamic range in processing a sound signal. However, for convenience of explanation, the obtained dynamic range will be referred to as a constrained dynamic range (or, an effective dynamic range (E-DR)) to distinguish from the conventional dynamic range. According to an embodiment of the present disclosure, since a minimum dynamic range is limited to −96 dB, a maximum dynamic range may be expressed by E-DR. For example, the E-DR of −66 dB may be 30 dB, and the E-DR of −50 dB may be 46 dB.

Hereinafter, a processing method for a sound signal based on a dynamic range corresponding to a setting volume level of the sound output apparatus 100, i.e. a constrained dynamic range will be described.

The processor 120 may process a sound signal based on the obtained constrained dynamic range.

According to an embodiment, the processor 120 may adjust the magnitude of a sound signal based on the constrained dynamic range.

The processor 120 may adjust the magnitude of a sound signal based on the constrained dynamic range of the sound output apparatus 100. The magnitude adjustment may be performed in a predetermined processing unit. For example, the predetermined processing unit may be at least one of one or more frame units, one or more scene units, one or more chunk units, one or more bin units, and one or more sample units. The audio scene may be identified (or determined) by detecting a silent section or a low energy section of audio.

Figure 4:
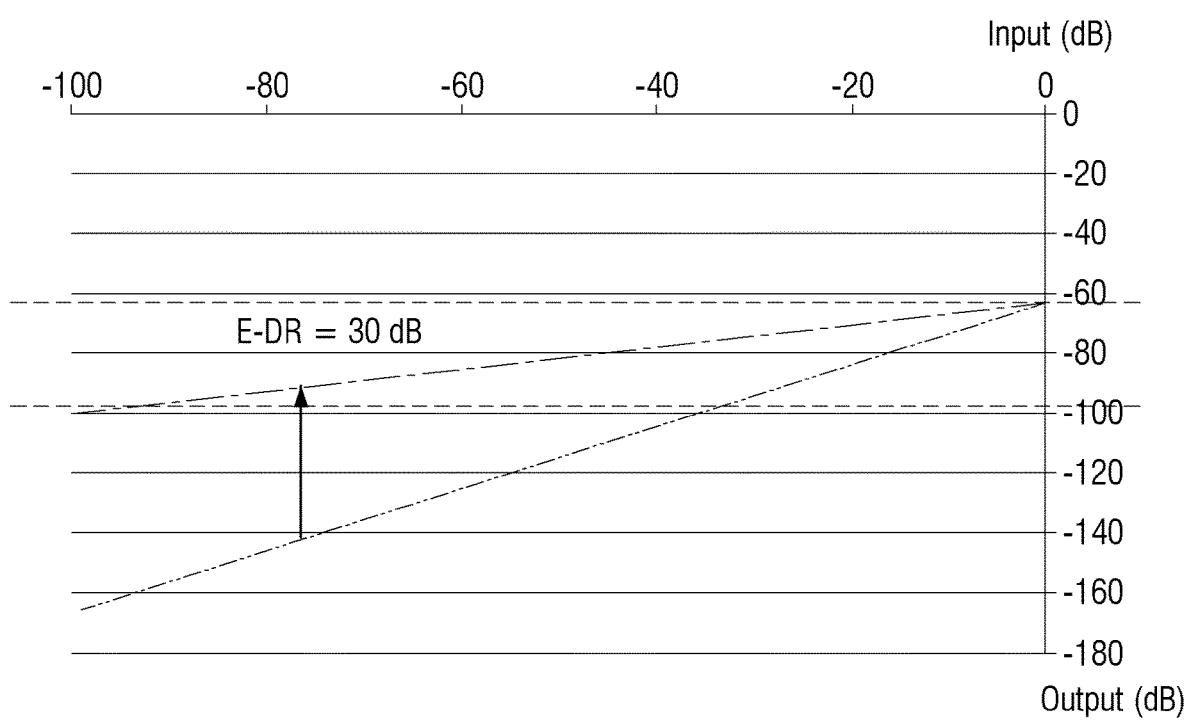
FIG. 4 is a view to explain a sound signal processing according to an embodiment of the present disclosure.

FIG. 4 is a view to explain a sound signal processing according to an embodiment of the present disclosure.

For example, as shown in FIG. 4, when a constrained dynamic range is from −96 dB to −66 dB, the magnitude of an input signal may be adjusted to be mapped in the range between −96 dB to −66 dB.

As an example, a signal component of the magnitude of 0 dB in a sound signal may be adjusted to −66 dB, and a signal component of the magnitude of −100 dB in a sound signal may be adjusted to −96 dB. The gain of a signal component of the magnitude of 0 dB may be −66 dB, and the gain of a signal component of the magnitude of −100 dB may be 4 dB.

In termed of tone mapping, as shown in FIG. 4, the magnitude of the input signal may be linearly mapped to be ranged in a constrained dynamic range where the magnitude of the input signal is limited. However, the present disclosure is not limited thereto, but the magnitude of the input signal may be may be non-linearly mapped. For example, the magnitude of the input signal may be mapped in various forms within a constrained dynamic range based on the characteristic of a sound signal, the AMP characteristic of the sound output apparatus 100, the filter characteristic, etc.

Tone mapping based on High Dynamic Range (HDR) may be a processing similar to the above-scribed tone mapping in an image processing method. The magnitude adjustment of the input signal based on the constrained dynamic range according to an embodiment of the present disclosure may be referred to as tone-mapping, and a series of signal processing processes based on the constrained dynamic range may be referred to as High Dynamic Range (HDR) signal processing.

According to another embodiment, the processor 120 may adjust the magnitude of a sound signal based on the constrained dynamic range and the auditory perception characteristic information. The auditory perception characteristic information may include at least one of a preset psychoacoustic model and a user customized auditory perception characteristic of a user.

In the normal human hearing system, there is a large difference in the degree of perception for each individual depending on the ear structure and the degree of damage to the auditory hair cells, and there are many psychological factors because the sound is different from the light. Psychoacoustics is a discipline that deals with the perception of sound, that is, the subjective auditory perception of sound and the cerebral response to auditory sensory signals. In terms of psychoacoustics, humans hear different kinds of hearing sounds at different frequencies, even though they have the same intensity.

Figure 5:
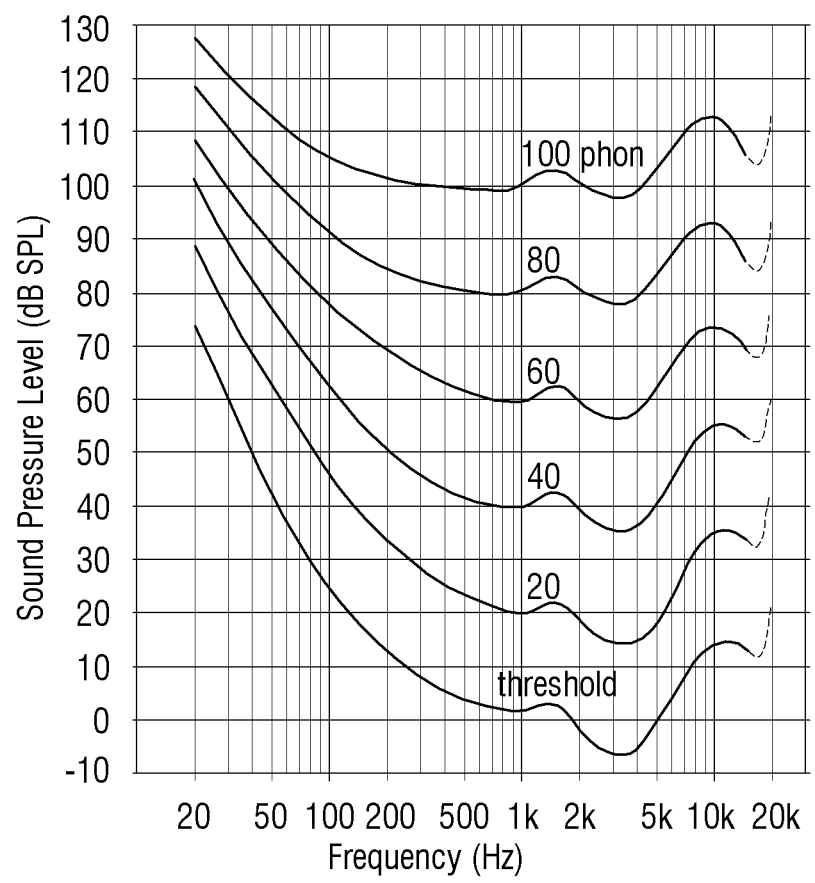
FIG. 5 is a graph showing equal loudness contours that indicate a relationship between a sound pressure level and a frequency of an audio signal.

FIG. 5 is a graph that shows equal loudness contours indicating a relationship between a sound pressure level and a frequency of an audio signal.

For example, FIG. 5 is a graph illustrating equal loudness contours that represent human auditory characteristic. A Y-axis of the equal loudness contours may be a sound pressure level (SPL) and represent a pressure of sound measured based on a minimum audible limit level in dB unit. An X-axis of the equal loudness contours may represent a frequency of an audio signal.

According to the equal loudness contours, even when an audio signal has the same decibel, the magnitude of sound perceived by a user may vary depending on the frequency of an audio signal. The intensity of sound physically measured may not coincide with the magnitude of sound that is actually perceived through a human auditory system. For example, if a user hears 70 dB sound at 50 hz and 70 dB sound at 200 hz, the human auditory system may perceive 70 dB sound at 200 hz as the sound of higher decibel. In addition, the 60 dB sound at 1 kHz and the 70 dB sound at 200 hz may be considered to have the same magnitude.

The processor 120 may perform tone mapping based on a psychoacoustic curve. The processor 120 may perform tone mapping considering not only the magnitude of an input signal but also the frequency of the input signal. For example, signal components of the same magnitude may be tone mapped in different magnitudes depending on the frequency. Such tone mapping may be referred to as Psychoacoustic Tone-Mapping Operation (PA-TMO).

For example, according to an embodiment shown in FIG. 5, a signal component of the magnitude of 0 dB in a sound signal may not be collectively adjusted to the magnitude of −66 dB, but adjusted to a different magnitude according to the frequency based on the equal loudness contours, and a signal component of the magnitude of −100 dB in a sound signal may not be collectively adjusted to the magnitude of −96 dB, but adjusted to a different magnitude according to the frequency based on the equal loudness contours.

The equal loudness contours as shown in FIG. 5 itself may be used, but a value pre-stored in the storage 130 (or an external apparatus) such as a curve that is modified to correspond to the characteristic of the sound output apparatus 100 or a look-up table may be used. For example, the storage 130 may store a curve that is obtained by normalizing the equal loudness contours to correspond to the characteristic of the sound output apparatus 100. Normalizing refers to an operation that transforms data according to certain rules to make it easier to use. According to an embodiment, the equal loudness contours may be changed to correspond to sound pressure of each volume level of the sound output apparatus 100. For example, the curve obtained by normalizing the equal loudness contours from a phon unit to a dB unit corresponding to a volume level of the sound output apparatus 100 may be stored.

The sound output apparatus 100 may have different sound pressures corresponding to the setting volume by manufacturer, by sound output apparatus type, or by model. Accordingly, a curve that is obtained by normalizing each equal loudness contour to a sound pressure matched with a volume level of the sound output apparatus 100 may be stored and tone mapping may be performed based thereon.

The above-described various models or curves may be pre-stored in the storage 130 in the form of an algorithm or a look-up table.

According to another embodiment, the processor 120 may process a sound signal based on not only the constrained dynamic range and the psychoacoustic model but also the characteristic of a sound signal. For example, when the sound signal has a significant amount of components in a low frequency band, or the components are excessively dense, the sound signal may be output in the form of having an excessive base when the volume level is adjusted to a lower decibel. Accordingly, the processor 120 may adjust the magnitude of a sound signal based on the characteristic of the sound signal. For example, when a sound signal has a large amount of components in a lower frequency band, higher gain may be given to the component, the PA-TIMO processing may not be performed at a period of time where a large amount of components in a lower frequency band exist, or the PA-TMO processing may not be processed on the sound signal.

The processor 120 may cause a speaker (or a loud speaker) to transmit optimal sound without excessive base or treble depending on a low frequency band, a middle frequency band, and a high frequency band considering the characteristic of a sound signal.

The HDR signal processing (e.g., PA-TMO) may be performed in at least one of a time domain, a frequency domain and a hybrid domain.

Figure 6A:
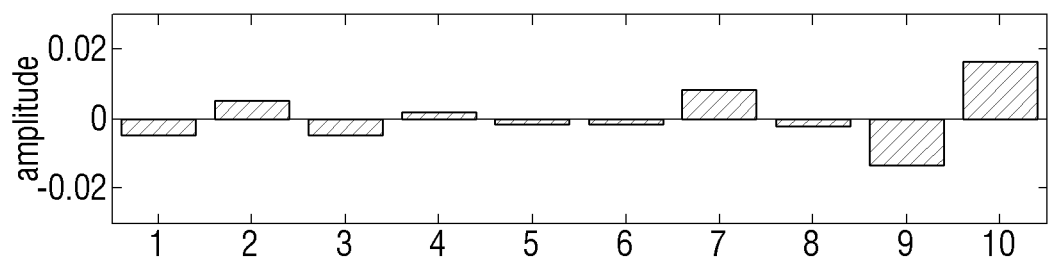
FIGS. 6A, 6B, and 6C are views to explain a signal processing method in a frequency domain according to an embodiment of the present disclosure.
Figure 6B:
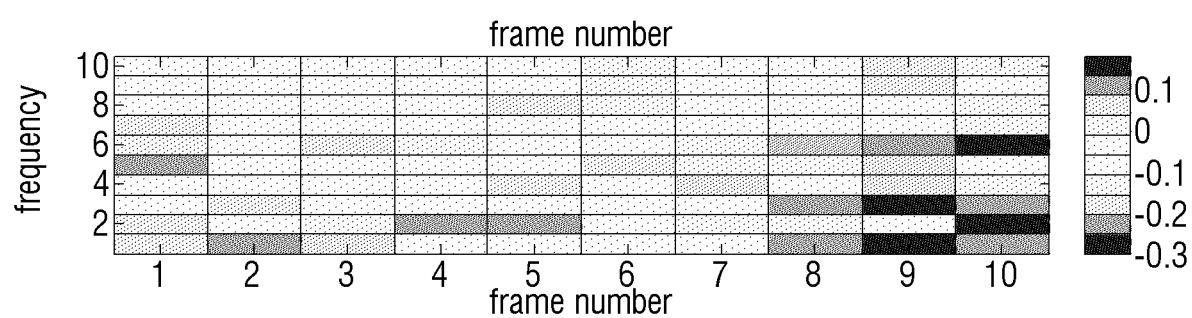

FIGS. 6A and 6B are views to explain a signal processing method in a frequency domain according to an embodiment of the present disclosure.

FIG. 6A is a view illustrating a signal magnitude for each predetermined processing unit (or a predetermined interval unit) (e.g., a frame) of a sound signal according to an embodiment of the present disclosure. In other words, FIG. 6A shows a signal magnitude on a time axis of a sound signal.

For example, the processor 120 may adjust the magnitude of a signal in each frame so that the signal is to be within a constrained dynamic range based on the signal magnitude for each frame. However, as described above, the processor 120 may adjust a signal magnitude for each frequency component based on a frequency component and equal loudness contours of each frame.

FIG. 6B is a view illustrating frequency distribution and a magnitude of each frequency included in each frame signal in a frequency domain after FFT conversion of a sound signal according to an embodiment of the present disclosure.

Referring to FIG. 6B, a horizontal axis may represent each frame arranged in time order, and a vertical axis may represent a frequency component of each frame. For convenience of explanation, each frequency (Hz) may be defined by an indicator ranging from 1 to 10, a frequency may be divided into a plurality of levels, and a magnitude level for each frequency component of each frame may be defined by hatching. When the interval including 256 samples is defined as one frame and 48000 samples are reproduced in one second, one frame interval may become 256/48000=5.3 mm/sec.

The processor 120 may map the magnitude of each frequency component to a different magnitude within a constrained dynamic range based on the equal loudness contours corresponding to each frequency component. The processor 120 may identify (or determine) the magnitude of a signal to be mapped within a constrained dynamic range for each frame based on FIG. 4, and identify (or determine) a signal magnitude to be adjusted based on the equal loudness contours shown in FIG. 5 so that each frequency component may have a identified (or determined) signal magnitude value.

According to another embodiment, as shown in FIG. 6B, the processor 120 may map the magnitude of each frequency component to be different within a constrained dynamic range based on the equal loudness contours corresponding to the magnitude of each frequency component. The processor 120 may determine the magnitude of a signal to be mapped in the constrained dynamic range for each frequency component in each frame, and determine the magnitude of a signal to be adjusted based on the equal loudness contours shown in FIG. 5 so that each frequency component may have a determined signal magnitude.

Figure 6C:
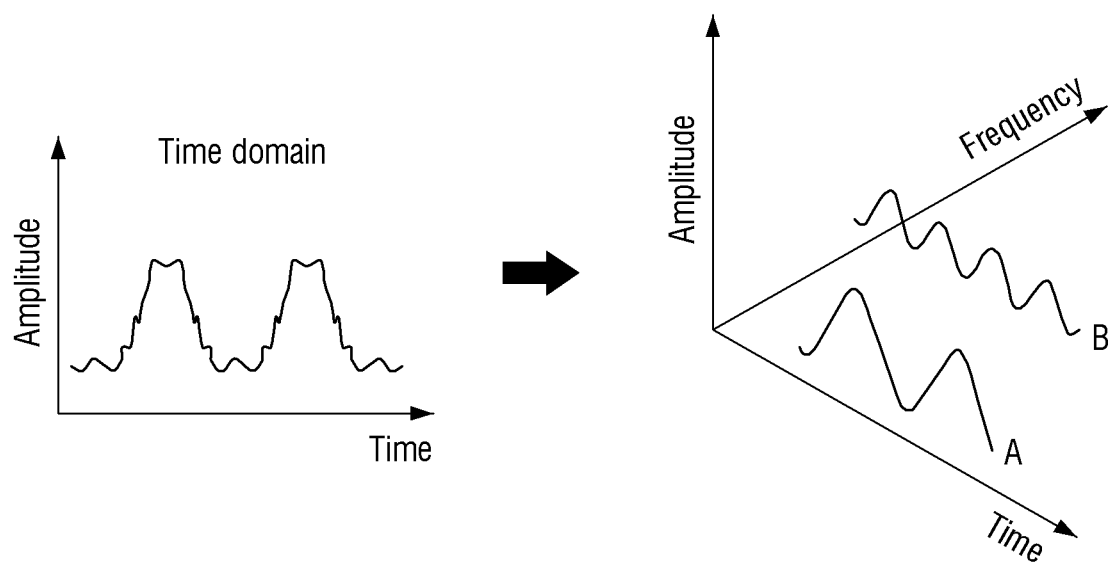

FIG. 6C is a view provided to explain a signal processing method in a time domain according to another embodiment of the present disclosure.

Referring to FIG. 6C, a sound signal in a time domain may be divided into a plurality of signals A and B of different frequency.

The processor 120 may adjust magnitudes of signals to be mapped to different values within a constrained dynamic range based on the magnitude of each of the plurality of signals A and B, and determine the magnitude of each of the plurality of signals A and B of which frequency is to be adjusted based on a frequency value of each of the plurality of signals A and B and the equal loudness contours shown in FIG. 5.

In addition, according to the various sound processes (e.g., PA-TMO) described above, a filter coefficient of the filter applied to either the time domain, the frequency domain, or the hybrid domain may be reflected.

The processor 120 may apply the PA-TMO according to an embodiment of the present disclosure to a filter coefficient of wave-shaping filters that are applied to one of the time domain, the frequency domain, the hybrid domain, etc. For example, the processor 120 may apply a filter coefficient of at least one of shelving filters and RLB weighting curves to the PA-TMO according to an embodiment of the present disclosure.

Figure 7A:
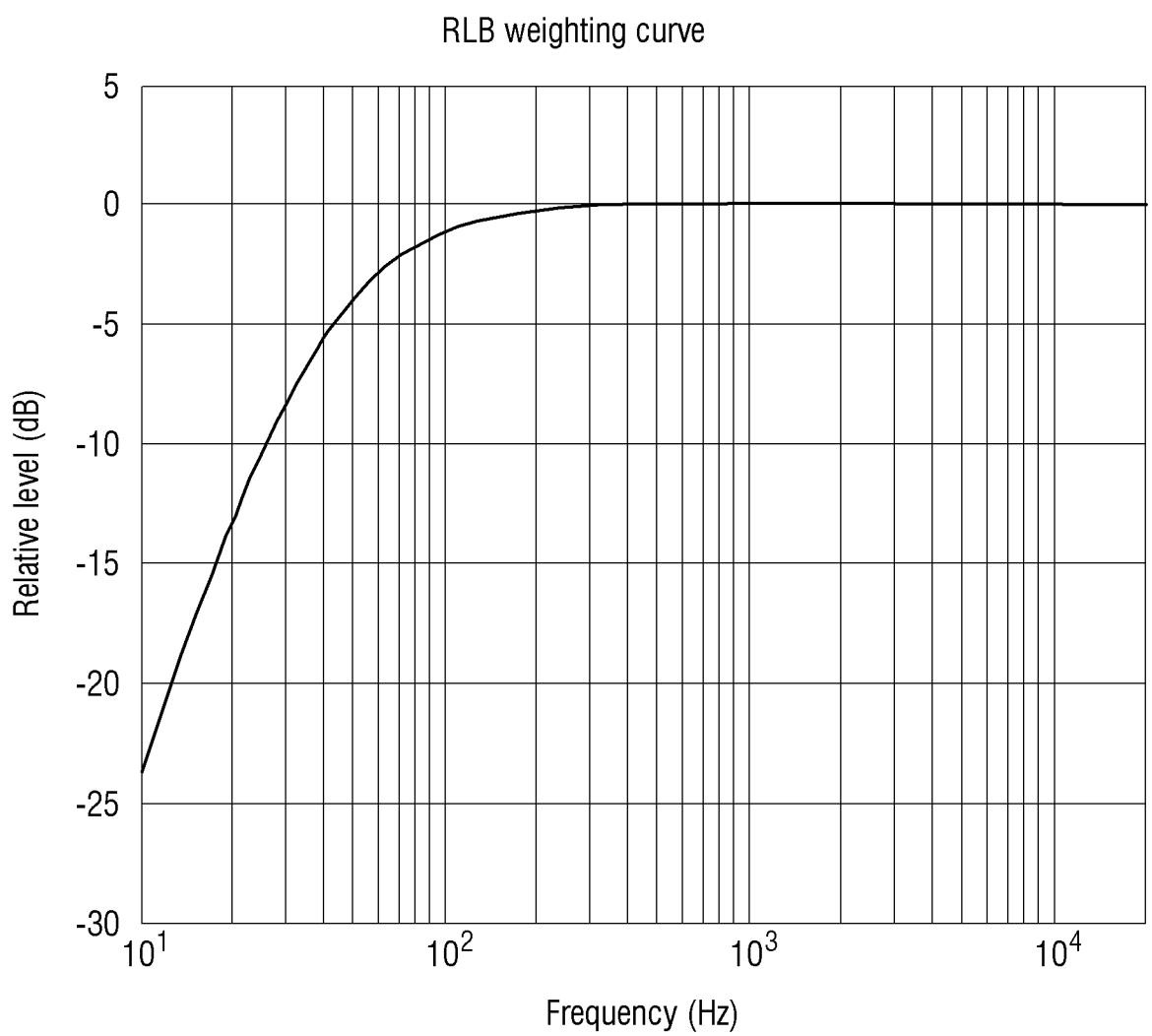
FIGS. 7A and 7B are views illustrating a shelving filter and an RLB weighting filter according to an embodiment of the present disclosure.
Figure 7B:
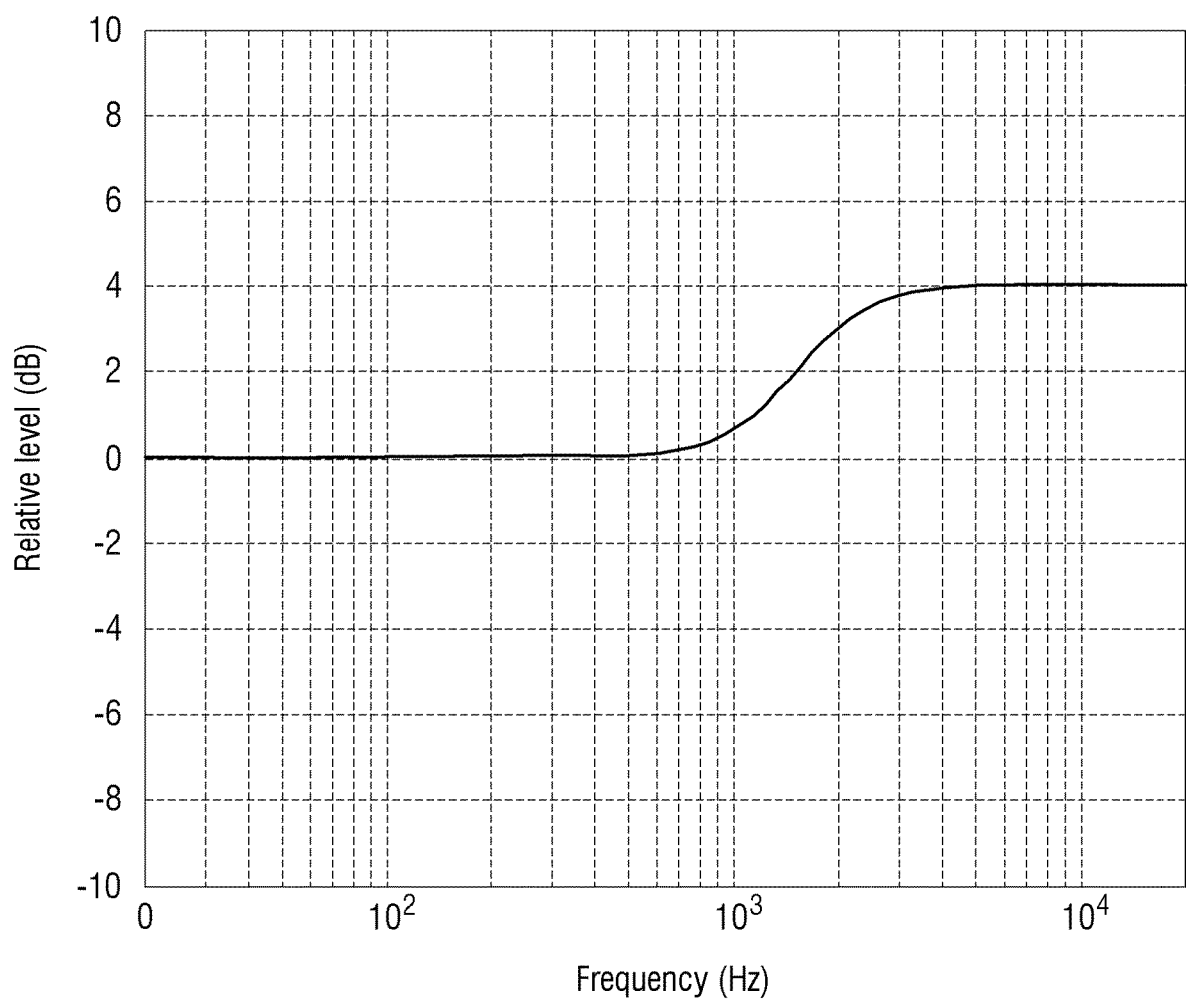

FIGS. 7A and 7B are views illustrating a shelving filter and an RLB weighting filter according to an embodiment of the present disclosure.

The RLB weighting curve shown in FIG. 7A may be an example embodiment of a weighting filter based on the characteristic of human hearing system. The processor 120 may design the RLB weighting filter to perform the PA-TMO. A parameter of the RLB weighting filter for performing the PA-TMO for each volume level may be pre-stored in the storage 130.

The shelving filter shown in FIG. 7B is an example of a filter that reflects the sound perception characteristic according to human brain. The processor 120 may design the RLB weighting filter so that the PA-TMO may be performed. In addition, the parameter of the shelving filter that performs the PA-TMO for each volume level may be pre-stored in the storage 130.

The above-described sound processing may be performed in a bin unit in case of frequency domain processing. The processor 120 may perform overlapping and processing of a frame in a bin unit.

Figure 8A:
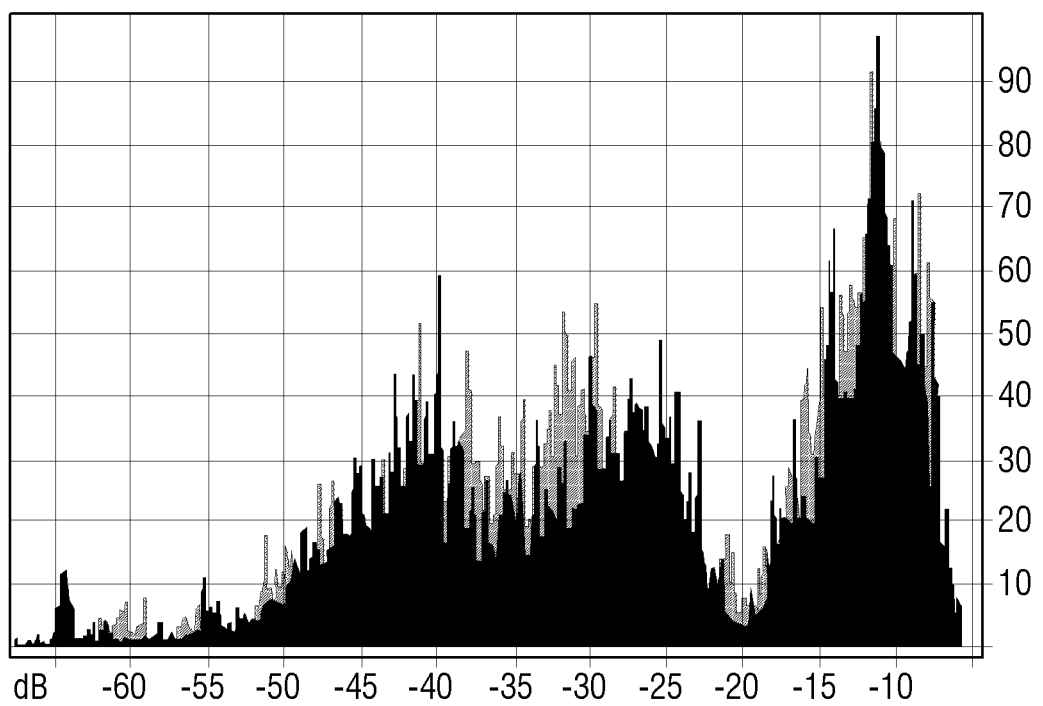
FIGS. 8A, 8B and 8C are views illustrating a sound processing result according to an embodiment of the present disclosure.
Figure 8B:
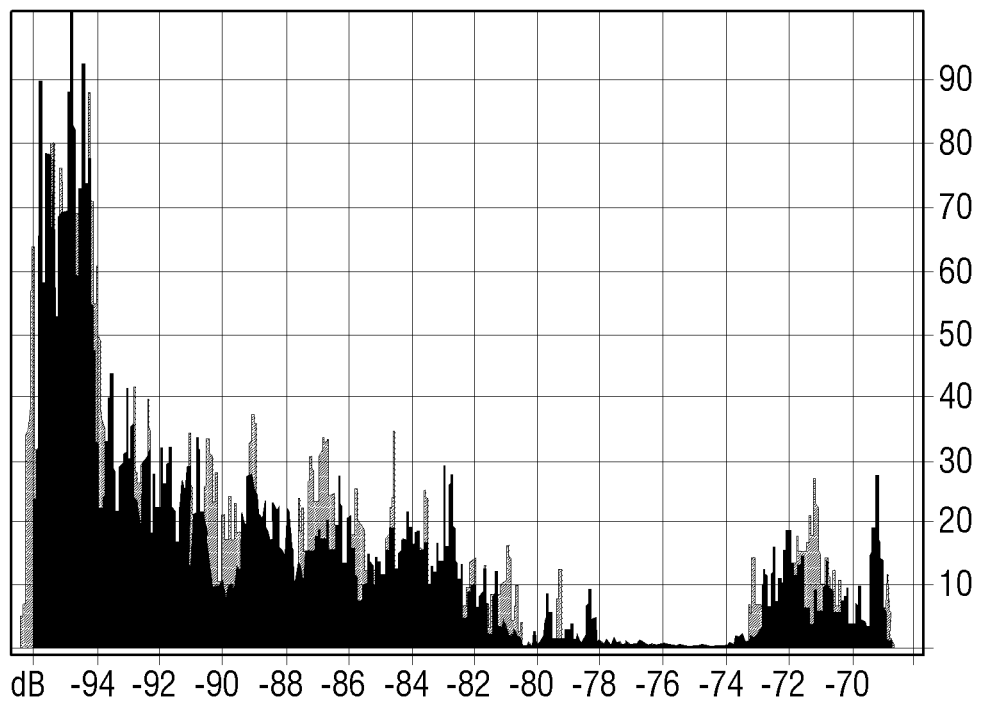
Figure 8C:
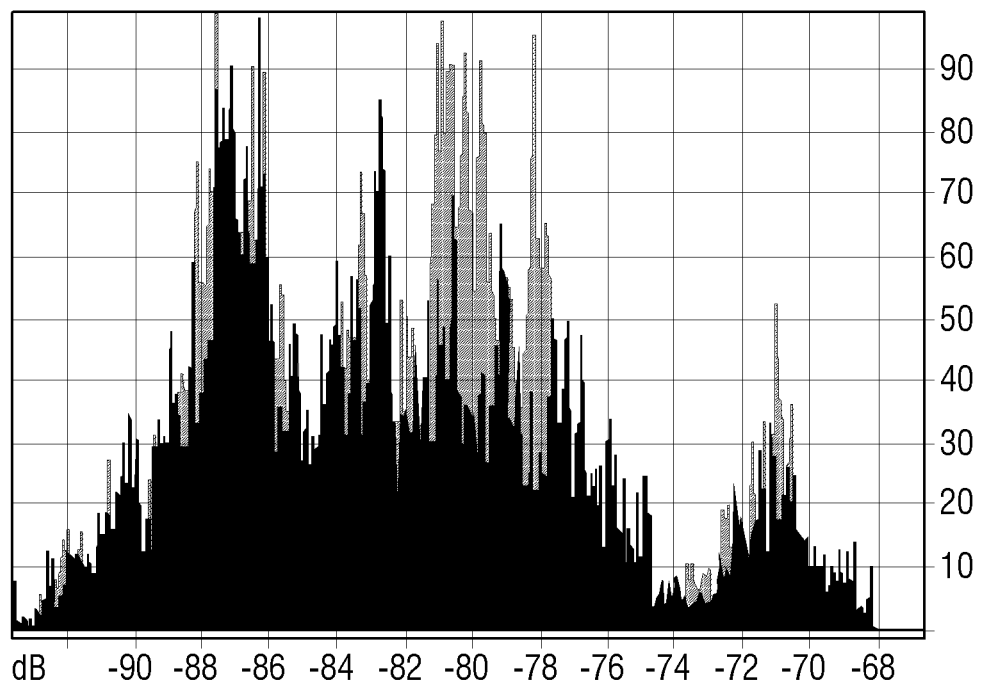

FIGS. 8A to 8C are views illustrating a sound processing result according to an embodiment of the present disclosure.

FIG. 8A shows a dynamic range of an input sound signal, and FIG. 8B shows a dynamic range of a sound signal when a volume is reduced by −60 dB, and FIG. 8C shows a dynamic range of a sound signal after the PA-TMO is applied.

According to another embodiment, the processor 120 may selectively perform various signal processing.

When the input sound signal is a compressed sound signal such as mp3 sound, the processor 120 may restore high-frequency range which is missed by signal compression to transmit natural sound and audio of high quality. However, such high-frequency restoration may be easily achieved when the dynamic range increases, i.e. as the setting volume level is higher.

The processor 120 may restore the high-frequency range based on a dynamic range corresponding to a setting volume. For example, high-frequency restoration may be performed only when a setting volume is greater than a predetermined level.

For another example, the processor 120 may perform smoothing processing to maintain temporal continuity between processing units (e.g., frames).

When a difference in magnitude between first and second sound signals included in a first processing unit and a second processing unit adjacent to the first processing unit is greater than a predetermined threshold magnitude, at least one of the magnitudes of first and second sound signals may be further adjusted so that the magnitude difference between the first and second sound signals may be smaller than a predetermined threshold magnitude.

When a difference in magnitude between the first and second sound signals included in the boundary area between the first processing unit and the second processing unit is greater than a predetermined threshold magnitude, the processor 120 may further adjust at least one of the magnitudes of the first and second sound signals included in the boundary area therebetween.

The processor 120 may apply appropriate gain to each audio frame and prevent sudden change of a signal magnitude. Such smoothing processing may prevent a sudden change of signal level from one frame to a neighboring frame and the smoothing processing may be performed in a frame unit. For example, smoothing processing may be performed by giving the same gain or different gain to all samples included in at least one of the frame and the neighboring frame.

Figure 9:
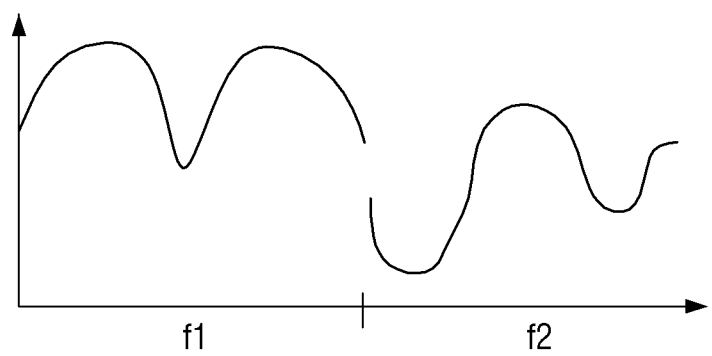
FIG. 9 is a view to explain a smoothing processing according to an embodiment of the present disclosure.
Figure 9:
Figure 9:
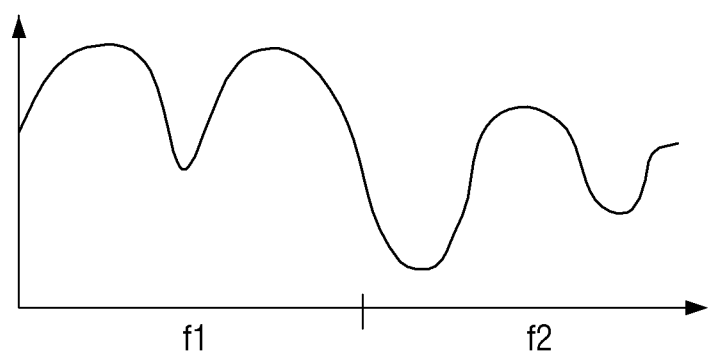

However, the present disclosure is not limited thereto, but the processor 120 may perform smoothing processing on a sample-by-sample basis, which constitutes a frame. For example, as shown in FIG. 9, the smoothing processing may be performed by applying appropriate gain to at least part of samples included in at least one boundary between the frame and the neighboring frame.

Various signal processing such as digital filtering, effect, sound field effect, etc. may be further performed in addition to the above-described signal processing. An oversampling technique for preventing deterioration in sound quality during conversion between a digital signal and an analog signal through a sample rate converter (SRC) may also be used.

The storage 130 may store various data, programs or applications for driving/controlling the sound output apparatus 100. The storage 130 may store a control program for controlling the sound output apparatus 100 and the processor 120, an application that is initially provided by a manufacturer or downloaded from an external source, databases or relevant data.

The storage 130 may store information on the equal loudness contours with respect to sound pressure information for each volume level, various sound pressure levels. The processor 120 may identify a sound pressure corresponding to the set volume level, obtain the equal loudness contours corresponding to the identified sound pressure and process a sound signal based on the obtained equal loudness contours and the constrained dynamic range.

According to another embodiment, the storage 130 may store information generated by normalizing the equal loudness contours to a sound pressure matched with each volume level of the sound output apparatus 100 (e.g., a normalizing curve or a look-up table). The processor 120 may obtain a normalized curve corresponding to the sound pressure of the set volume level and process a sound signal based on the obtained normalized curve and the constrained dynamic range.

According to another embodiment, the storage 130 may store information obtained by normalizing the equal loudness contours to a dynamic range for each volume level of the sound output apparatus 100 (e.g., a normalized curve or a look-up table). The processor 120 may obtain a normalized curve corresponding to the dynamic range of the set volume level and process a sound signal based on the obtained normalized curve.

According to another embodiment, when the PA-TMO is performed by a filter, the storage 130 may store parameter information of a filter calculated to perform the PA-TMO (or gain information).

The storage unit 130 may be implemented as an internal memory such as a ROM or a RAM included in the processor 120, or may be implemented as a separate memory from the processor 120. In this case, the storage unit 150 may be implemented as a memory embedded in the audio output apparatus 100 or a memory removable from the audio output apparatus 100 depending on the purpose of data storage. For example, data for driving the sound output apparatus 100 may be stored in a memory embedded in the sound output apparatus 100, and data for an extension function of the sound output apparatus 100 may be stored in a memory that can be removable from the sound output apparatus 100. The memory embedded in the sound output apparatus 100 may be implemented in the form of a nonvolatile memory, a volatile memory, a hard disk drive (HDD), a solid state drive (SSD), or the like, and a memory removable from the sound output apparatus 100 may be embodied as a memory card (e.g., a micro SD card, a USB memory or the like), an external memory that is connectable to a USB port (e.g., a USB memory), or the like.

The output unit 140 may output a sound signal processed by the processor 120.

The output unit 140 may convert a digital signal processed by the processor 120 into an analogue signal and amplify and output the analogue signal. For example, the output unit 140 may include at least one speaker unit, D/A convertor, or audio amplifier that outputs at least one channel. For example, the output unit 140 may include an L channel speaker and an R channel speaker that respectively reproduce an L channel and an R channel. However, the present disclosure is not limited thereto. The output unit 140 may be embodied as various forms. For another example, the output unit 140 may be embodied as a sound bar form that reproduces an L channel, an R channel, and a center channel.

Figure 10:
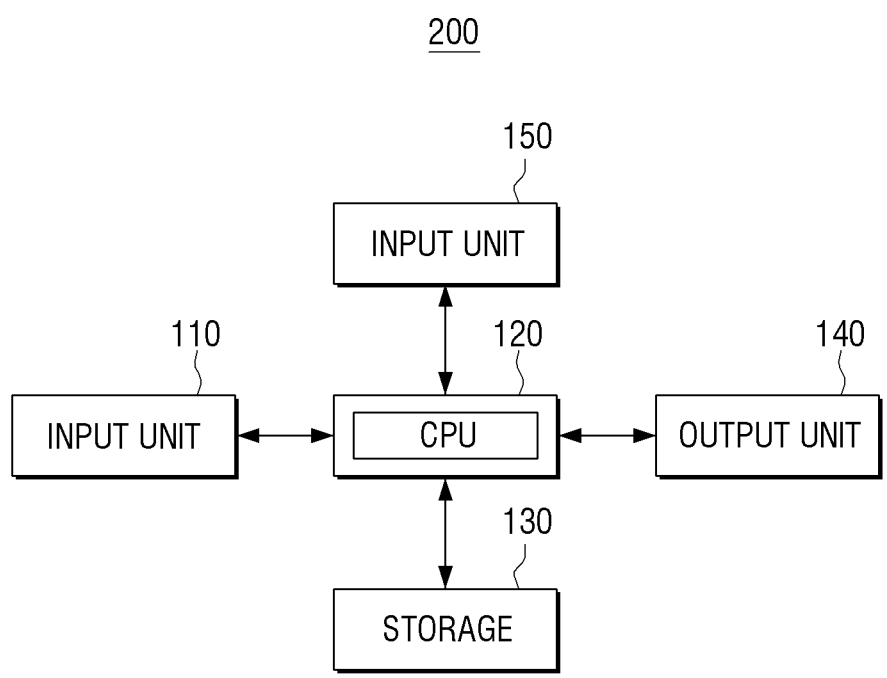
FIG. 10 is a block diagram illustrating configuration of the sound output apparatus shown in FIG. 2 when the sound output apparatus is embodied as a display apparatus.

FIG. 10 is a block view illustrating configuration of the sound output apparatus shown in FIG. 2 when the sound output apparatus is embodied as a display apparatus.

Referring to FIG. 10, a display apparatus 200 may include an input unit 110, a processor 120, a storage 130, an output unit 140 and a display 150. The redundant description of constituent elements shown in FIG. 9 as those shown in FIG. 2 will be omitted.

The processor 120 may include a CPU 121, a ROM (or non-volatile memory) that stores a control program for controlling the display apparatus 200 and a RAM (or volatile memory) that stores data input from the outside of the sound output apparatus 100 or is used as storage corresponding to various tasks that performed by the sound output apparatus 100.

The CPU 121 may access the storage 130 and perform booting using the O/S stored in the storage 130. The CPU 121 may perform various operations by using various programs, contents and data stored in the storage 130.

Typically, a digital TV may receive a sound signal in a stereo format. The dialogue/voice level may be important for listening experience of a user. Accordingly, the sound output apparatus 100 may perform signal processing according to an embodiment with respect to a center signal. However, in some cases, signal processing according to an embodiment of the present disclosure may be performed with respect to a center signal and an ambient signal, but the degree of signal processing may be different.

Figure 11A:
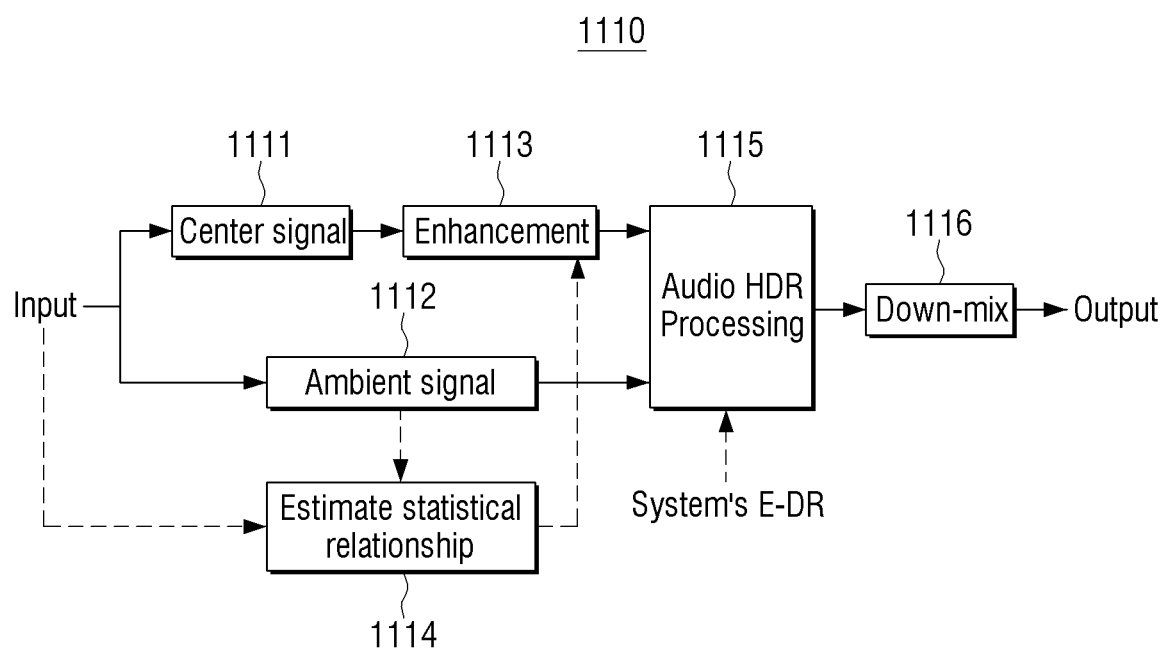
FIGS. 11A and 11B are views to explain a stereo signal processing method according to an embodiment of the present disclosure.
Figure 11B:
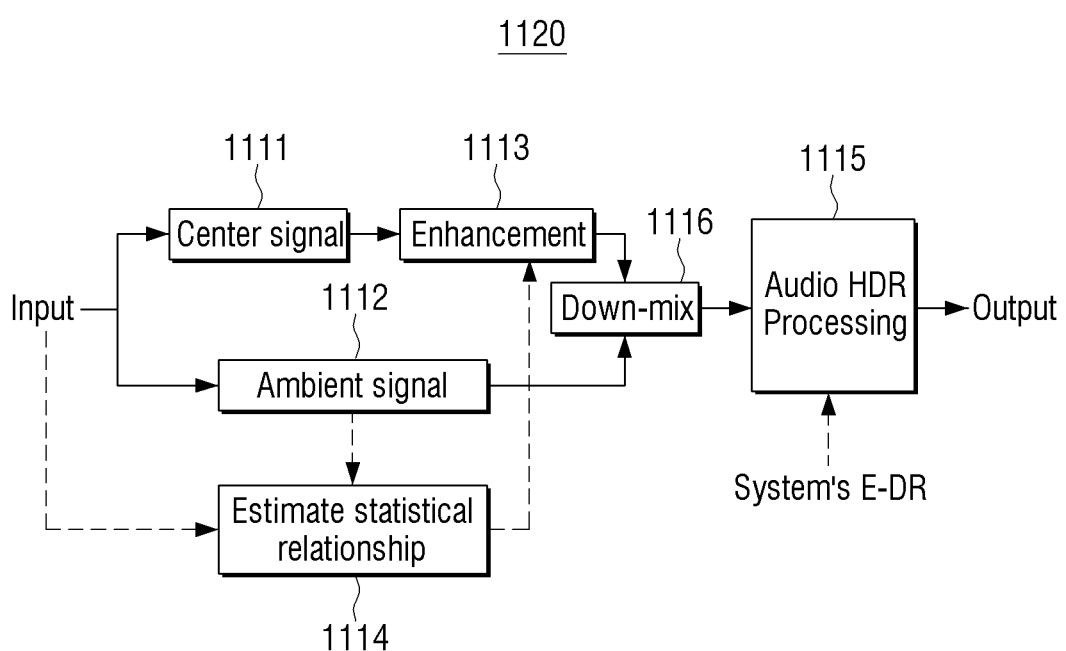

FIGS. 11A and 11B are views to explain a stereo signal processing method according to an embodiment of the present disclosure.

According to an embodiment, based on a stereo signal being received, the processor 120 may divide the stereo signal into a center (or primary) signal 111 and an ambient (reverberation, applause, wind, various background sounds, etc.) signal 1112. The processor 120 may perform HDR processing 1114 according to an embodiment of the present disclosure only with respect to a center signal. The redundant description of the HDR processing will be omitted.

According to another embodiment, the signal processing according to an embodiment of the present disclosure may be performed when a voice is present in the center signal 1111, or the signal processing may be performed by giving different gain to an interval where a voice is present. Whether a voice is present in the center signal 1111 may be determined based on a correlation value of the input signal and the ambient signal 1112. For example, as a voice is present in the input signal and the center signal 1111, a correlation value between the input signal and the ambient signal 1112 may be low in a position where a voice is present. In addition, whether a voice is present in the center signal 1111 may be determined based on the frequency variation of the center signal 1111. For example, if the number of frequencies where a magnitude variation is greater than or equal to a threshold value is greater than or equal to the threshold number in a present frame compared to in a previous frame in the center signal 1111, it is determined that a voice is present in the present frame.

The processor 120 may individually perform HDR processing 1115 according to an embodiment of the present disclosure to each of the center signal 1111 and the ambient signal 1112 (FIG. 11A), or directly perform the HDR processing 1115 to an enhanced stereo signal (FIG. 11B).

Typically, each of the center signal 1111 and the ambient signal 1112 may be rendered (e.g., enhanced after voice enhanced filtering or sound effect emphasis filtering) and mixed 1116 to an output channel of the sound output apparatus 100. The number of output channels may be the same as the number of input channels, or may be increased or reduced from the number of input channels. For example, if the number of output channels is smaller than the number of input channels, the input channel may be down-mixed corresponding to the number of output channels. For another example, if the number of output channels is greater than the number of input channels, the input channel may be up-mixed corresponding to the number of output channels. The processor 120 may include a mixer (or an audio mixer) for performing mixing or may be embodied to control an additional mixer.

The processor 120 may perform sound processing (e.g., HDR processing or PA-TMO) according to an embodiment of the present disclosure with respect to at least one of a center signal or an ambient signal before the rendered center signal 1111 and the ambient signal 1112 are mixed (FIG. 11A). In this case, the center signal 1111 may be enhanced based on a statistical correlation value 1114 of the input signal and the ambient signal 1112, and the HDR processing may be performed with respect to the enhanced center signal 1111. For example, since a voice is present in the input signal and the center signal 1111, a correlation value between the input signal where a voice is present and the ambient signal 1112 may be low, and various enhancement processes may be performed with respect to the center signal based thereon.

According to another embodiment, the processor 120 may perform sound processing (e.g., HDR processing or PA-TMO) according to an embodiment of the present disclosure to the enhanced stereo signal, i.e. after the enhance center signal 1111 and the ambient signal 1112 are mixed (FIG. 11B).

However, the above-described embodiment is merely an example of the case where a user wants to have clear delivery of news or soap dramas. The signal processing method may be changed according to various listening experiences desired by a user (e.g., glamour of music, emphasis on certain special effects in movies, etc.). For example, it is possible to perform HDR processing or PA-TMO processing on an ambient signal if the user wishes to enjoy background music.

The display 150 may provide various content screens that can be provided through the sound output apparatus 100. The content screen may be various contents such as image, texts, videos, music, etc., an application execution screen including various contents, a Graphic User Interface (GUI) screen, etc. For example, when HDR processing is applicable according to a user selection, or when a user excludes part of the plurality of signal processes included in the HDR processing, the display 150 may provide a UI screen for setting the corresponding option or the like under the control of the controller 120.

The display 150 may be embodied as various types of displays such as a liquid crystal display, an organic light-emitting diode (LED), a liquid crystal on silicon (LCoS), a digital light processing (DLP), or the like. Also, the display 150 may be embodied as a transparent display that is implemented with a transparent material and displays information. Meanwhile, the display 150 may be implemented as a touch screen having a layer structure with the touch pad. In this case, the display 150 may be used as a user interface in addition to an output device.

Figure 12:
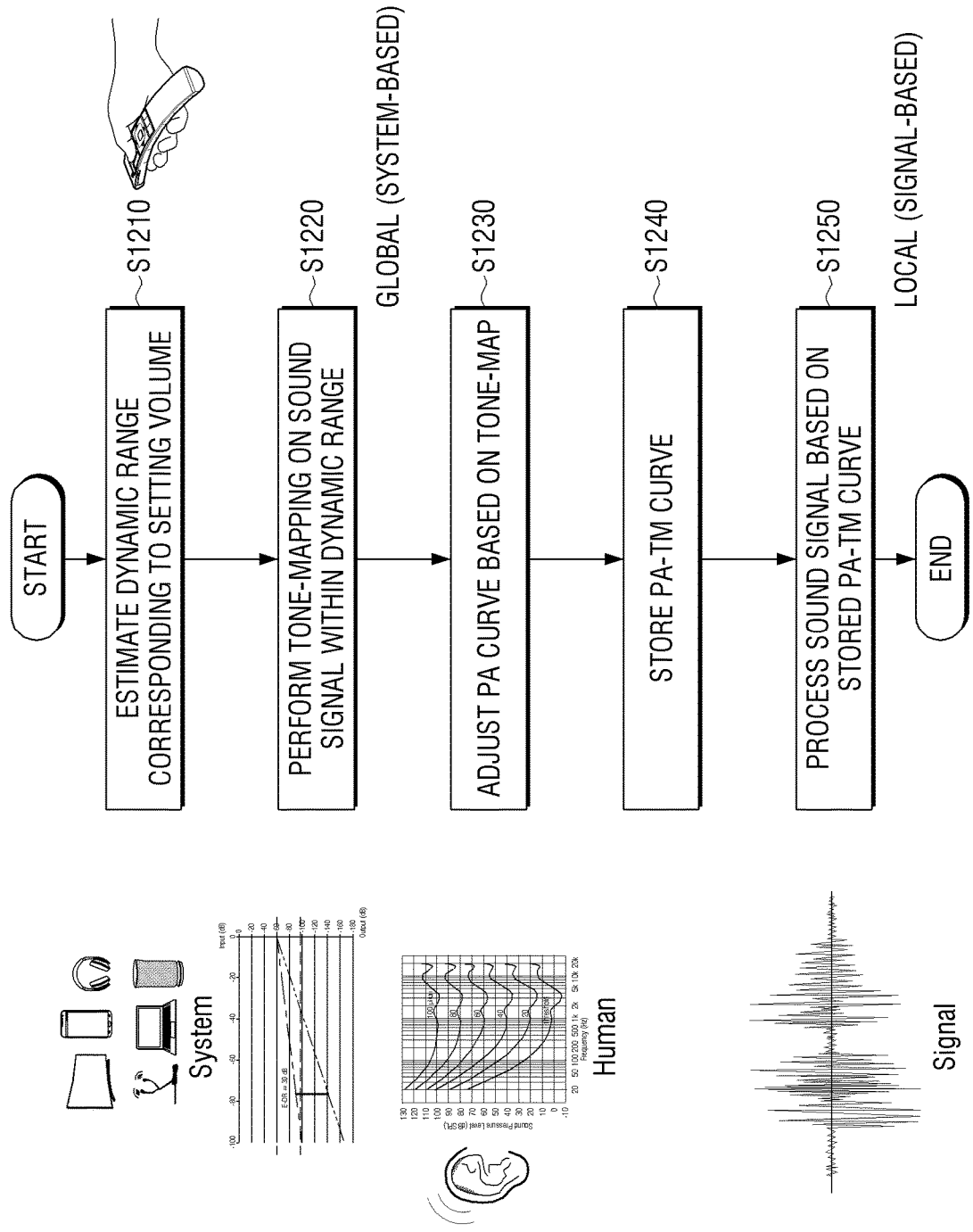
FIG. 12 is a view to explain a method for calculating information stored in a storage according to another embodiment of the present disclosure.

FIG. 12 is a view to explain a method for calculating information stored in a storage according to another embodiment of the present disclosure.

FIG. 12 is a view to plain a calculating method for information obtained by normalizing the equal loudness contours based on a volume level of the sound output apparatus 100 among information stored in the storage 130.

Referring to FIG. 12, the processor 120 may obtain a dynamic range corresponding to each volume level of the sound output apparatus 100 at step S1210, and perform tone-mapping of each magnitude of a virtual input signal to the obtained dynamic range at step S1220. The processor 120 may map each magnitude of the virtual input signal to a magnitude corresponding within a dynamic range. In this case, the processor 120 may obtain gain information for adjusting each magnitude of the virtual input signal to the mapped magnitude.

The processor 120 may adjust a psychoacoustic curve (PA curve) based on the tone map obtained at step S1220. For example, the processor 120 may adjust the equal loudness contours shown in FIG. 5 based on the gain information obtained at step S1220. The PA curve may be stored in the storage 130 in the form of the curve itself or a look-up table. For another embodiment, the processor 120 may obtain gain information applicable to each frequency magnitude based on the gain information obtained at step S1220 and the equal loudness contours shown in FIG. 5. The obtained gain information may be stored in the storage 130 in the form of a look-up table. However, calculating of the PA-TM curve may need not necessarily be performed by the processor 120 of the sound output apparatus 100 and the sound output apparatus 100 may receive and store the information calculated from an external apparatus or an external server. The external apparatus or the external server may calculate the PA-TM curve based on the information by receiving the volume level information of the sound output apparatus 100.

Receiving a sound signal, the processor 120 may process a sound signal based on information stored in the storage 130 at step S1250.

According to the above-described embodiment, it is described that the processor 120 calculates the information, but the information may be calculated from the external apparatus or the external server and the sound output apparatus 100 may receive and store the information.

However, the present disclosure is not limited thereto. The storage 130 may store information on sound pressure for each volume level and the equal loudness contours, and the processor 120 may calculate gain to be applied to a sound signal based on the magnitude of the input sound signal and the stored information in real time.

Figure 13:
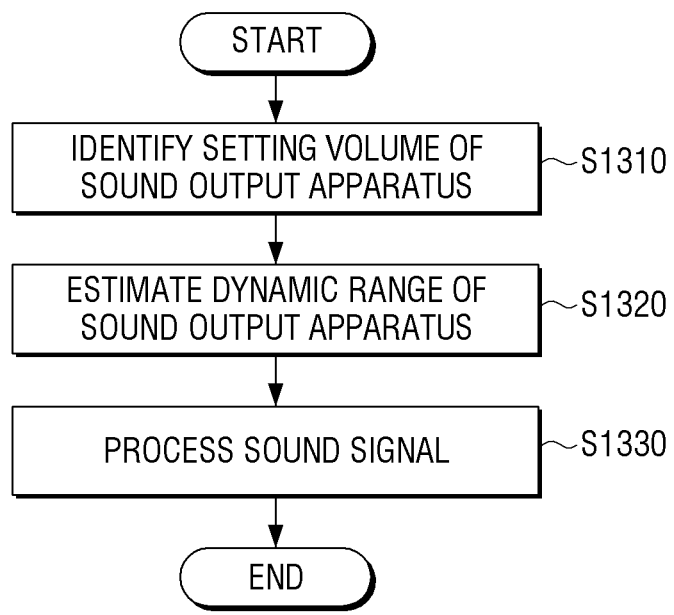
FIG. 13 is a flowchart to explain a signal processing method for a sound output apparatus according to an embodiment of the present disclosure.

FIG. 13 is a flowchart to explain a signal processing method for a sound output apparatus according to an embodiment of the present disclosure.

According to a signal processing method of a sound output apparatus shown in FIG. 13, the dynamic range of the sound output apparatus 100 may be obtained based on the currently set volume at step S1310. The sound output apparatus 100 may obtain a dynamic range corresponding to the currently set volume based on the mapping information between a pre-stored volume level and a dynamic range.

The input sound signal may be processed based on the obtained dynamic range at step S1320.

The processed sound signal may be output at step S1330.

Based on a volume level set according to a user command being changed, a changed dynamic range corresponding to the changed volume level may be obtained, and a sound signal may be processed based on the changed dynamic range.

The mapping information between a volume level and a dynamic range may be information to which audible level information of a user is reflected.

Step S1320 of processing a sound signal may include adjusting the magnitude of a sound signal to have a different magnitude for each frequency magnitude of a sound signal within a constrained dynamic range based on the auditory perception characteristic information. The auditory perception characteristic information may include at least one of the predetermined psychoacoustic model and the user-customized auditory perception characteristic information.

Step S1320 of processing a sound signal may include adjusting the magnitude of a sound signal based on the characteristic of a sound signal and the auditory perception characteristic information. The characteristic of a sound signal may include the characteristic with regard to a frequency component in a sound signal.

Step S1320 of processing a sound signal may include adjusting a filter coefficient of wave-shaping filters based on the constrained dynamic range and the auditory perception characteristic information and filtering a sound signal based on the adjusted filter coefficient.

Step S1320 of processing a sound signal may include calculating the magnitude of a sound signal in a predetermined processing unit, determining a first magnitude to be adjusted by the processing unit based on the constrained dynamic range and the calculated magnitude, and adjusting the first magnitude for each frequency component included in a processing unit based on the auditory perception characteristic information.

Step S1320 of processing a sound signal may include, when the difference in magnitude between the first and second sound signals included in the boundary area between the first processing unit and the second processing unit adjacent to the first processing unit is smaller than a predetermined threshold magnitude, further adjusting at least one of the first and second sound signals so that the difference between the first and second sound signals may be smaller than the predetermined threshold magnitude.

According to the above-described embodiments, a sound output apparatus may provide optimal sound contents in volume setting selected by a user. Accordingly, a user may enjoy easy and enjoyable listening experience.

The various embodiments described above may be implemented in a recording medium that can be read by a computer or a similar device using software, hardware, or a combination thereof. In some cases, embodiments described herein may be implemented by processor 120 itself. According to software implementation, embodiments such as the procedures and functions described herein may be implemented in separate software modules. Each of the software modules may perform one or more of the functions and operations described herein.

Meanwhile, computer instructions for performing the processing operations of the sound output apparatus 100 according to various embodiments of the present disclosure described above may be stored in a non-transitory computer-readable medium. The computer instructions stored in the non-volatile computer-readable medium cause a specific apparatus to perform the processing operations in the sound output apparatus 100 according to the various embodiments described above when executed by the processor of the specific apparatus.

The non-transitory computer readable medium refers to a medium that stores data semi-permanently rather than storing data for a very short time, such as a register, a cache, and a memory, and is readable by an apparatus. Specifically, the above-described various applications or programs may be stored in a non-transitory computer readable medium such as a compact disc (CD), a digital versatile disk (DVD), a hard disk, a Blu-ray disk, a universal serial bus (USB) memory stick, a memory card, and a read only memory (ROM), and may be provided.

Although exemplary embodiments have been shown and described, it will be appreciated by those skilled in the art that changes may be made to these exemplary embodiments without departing from the principles and spirit of the present disclosure. Accordingly, the scope of the present disclosure is not construed as being limited to the described exemplary embodiments, but is defined by the appended claims as well as equivalents thereto.

What is claimed is:

1. A sound output apparatus, comprising:
an inputter;
an outputter;
a storage to store mapping information between a volume level and a dynamic range of the sound output apparatus; and
a processor configured to:
obtain a dynamic range corresponding to a volume level currently set to the sound output apparatus based on the stored mapping information,
modify the dynamic range based on an audible level information of a user;
determine whether an input sound signal received through the inputter includes a predetermined amount of components in a predetermined frequency band, and selectively, based on the determination,
adjust a magnitude of the input sound signal within the modified dynamic range based on both a magnitude of the input sound signal and a frequency of the input sound signal, when the input sound signal does not include the predetermined amount of components in the predetermined frequency band,
adjust the magnitude of the input sound signal within the modified dynamic range based on the magnitude of the input sound signal, when the input sound signal does include the predetermined amount of components in the predetermined frequency band; and
control the outputter to output the adjusted sound signal,
wherein the audible level information of the user is obtained based on at least one of a user profile information or a user hearing measurement information.

2. The sound output apparatus as claimed in claim 1, wherein the processor is further configured to, based on the currently set volume level being changed, obtain a changed dynamic range corresponding to the changed volume level and process the input sound signal based on the changed dynamic range.

3. The sound output apparatus as claimed in claim 1, wherein the processor is further configured to adjust the magnitude of the input sound signal to be different for each frequency of the input sound signal within the modified dynamic range based on auditory perception characteristic information.

4. The sound output apparatus as claimed in claim 3, wherein the processor is further configured to adjust the magnitude of the input sound signal based on a characteristic of the input sound signal and the auditory perception characteristic information, and wherein the characteristic of the input sound signal includes a characteristic of a primary frequency component in the input sound signal.

5. The sound output apparatus as claimed in claim 3, wherein the auditory perception characteristic information includes at least one of a predetermined psychoacoustic model and user-customized auditory perception characteristic information.

6. The sound output apparatus as claimed in claim 3, wherein the processor is further configured to adjust a filter coefficient of wave-shaping filters based on the modified dynamic range and the auditory perception characteristic information, and filter the input sound signal based on the adjusted filter coefficient.

7. The sound output apparatus as claimed in claim 3, wherein the processor is further configured to identify the magnitude of the sound signal in a predetermined processing unit, identify a first magnitude to be adjusted by the processing unit based on the modified dynamic range and the identified magnitude, and adjust the first magnitude for each frequency component included in the processing unit based on the auditory perception characteristic information.

8. The sound output apparatus as claimed in claim 7, wherein the processor is further configured to, based on a difference in magnitude between a first sound signal and a second sound signal included in a boundary area between a first processing unit and a second processing unit adjacent to the first processing unit being greater than or equal to a predetermined threshold magnitude, further adjust at least one of magnitudes of the first sound signal and the second sound signal and a difference in magnitude between the first sound signal and the second sound signal is smaller than the predetermined threshold magnitude.

9. The sound output apparatus as claimed in claim 3, wherein the storage further stores gain information for adjusting the magnitude of a sound signal identified based on a dynamic range for each volume level of the sound output apparatus and the auditory perception characteristic information.

10. The sound output apparatus as claimed in claim 1, wherein the processor is further configured to, based on the input sound signal being a stereo signal, perform rendering of the stereo signal by separating the stereo signal into a center signal and an ambient signal, process at least one of the rendered center signal and the rendered ambient signal based on the modified dynamic range before the rendered center signal and the rendered ambient signal are respectively mixed, or process a signal obtained by mixing the rendered center signal with the rendered ambient signal based on the modified dynamic range.

11. The sound output apparatus as claimed in claim 1, wherein the processor is further configured to perform high frequency restoration based on the modified dynamic range in the case where the input sound signal is a compressed signal.

12. A signal processing method for a sound output apparatus, the method comprising:
    obtaining a dynamic range corresponding to a volume level which is currently set to the sound output apparatus based on mapping information between a volume level and a dynamic range of the sound output apparatus;
    modifying the dynamic range based on an audible level information of a user;
    determining whether an input sound signal received through the inputter includes a predetermined amount of components in a predetermined frequency band, and selectively, based on the determination,
        adjusting a magnitude of the input sound signal within the modified dynamic range based on both a magnitude of the input sound signal and a frequency of the input sound signal, when the input sound signal does not include the predetermined amount of components in the predetermined frequency band,
        adjusting the magnitude of the input sound signal within the modified dynamic range based on the magnitude of the input sound signal, when the input sound signal does include the predetermined amount of components in the predetermined frequency band; and
    outputting the adjusted sound signal,
    wherein the audible level information of the user is obtained based on at least one of a user profile information or a user hearing measurement information.

13. The method as claimed in claim 12, further comprising:
    based on the set volume level being changed according to a user command, obtaining a changed dynamic range corresponding to the changed volume level; and
    processing the sound signal based on the changed dynamic range.

14. The method as claimed in claim 12, wherein the processing of the input sound signal comprises adjusting the magnitude of the sound signal to be different for each frequency of the input sound signal within the modified dynamic range based on auditory perception characteristic information.

15. The method as claimed in claim 12, wherein the processing of the input sound signal comprises adjusting the magnitude of the input sound signal based on characteristic of the input sound signal and auditory perception characteristic information, and wherein the characteristic of the input sound signal includes characteristic of a primary frequency component in the sound signal.

16. The method as claimed in claim 15, where the auditory perception characteristic information includes at least one of a predetermined psychoacoustic model and user customized auditory perception characteristic information.

17. A non-transitory computer readable recording medium that stores a computer command for causing the sound output apparatus to perform an operation when executed by a processor of a sound output apparatus, wherein the operation comprises:
    obtaining a dynamic range of the sound output apparatus based on a volume level currently set to the sound output apparatus;
    modifying the dynamic range based on an audible level information of a user;
    determining whether an input sound signal received through the inputter includes a predetermined amount of components in a predetermined frequency band, and selectively, based on the determination,
        adjusting a magnitude of the input sound signal within the modified dynamic range based on both a magnitude of the input sound signal and a frequency of the input sound signal, when the input sound signal does not include the amount of components in the predetermined frequency band,
        adjusting the magnitude of the input sound signal within the modified dynamic range based on the magnitude of the input sound signal, when the input sound signal does include the predetermined amount of components in the predetermined frequency band; and
    outputting the adjusted sound signal,
    wherein the audible level information of the user is obtained based on at least one of a user profile information or a user hearing measurement information.

* * * * *